United States Patent
Liu et al.

(10) Patent No.: US 8,559,246 B2
(45) Date of Patent: Oct. 15, 2013

(54) DIGITAL RETENTION VOLTAGE GENERATION

(75) Inventors: Jack Liu, Taipei (TW); Shao-Yu Chou, Chu-Pei (TW); Wei Min Chan, Sindian (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 448 days.

(21) Appl. No.: 12/845,833

(22) Filed: Jul. 29, 2010

(65) Prior Publication Data
US 2011/0080798 A1 Apr. 7, 2011

Related U.S. Application Data

(60) Provisional application No. 61/248,019, filed on Oct. 2, 2009.

(51) Int. Cl.
*G11C 5/14* (2006.01)
(52) U.S. Cl.
USPC ............ 365/189.09; 365/230.08; 365/233.11; 365/233.12; 327/74; 327/538
(58) Field of Classification Search
USPC .................. 365/226, 189.06, 189.07, 189.08, 365/189.09, 189.12, 230.08, 233.11, 365/233.12; 327/74, 538
See application file for complete search history.

(56) References Cited

U.S. PATENT DOCUMENTS

| | | | |
|---|---|---|---|
| 5,051,707 A * | 9/1991 | Fujita | 330/279 |
| 7,595,645 B2 | 9/2009 | Fujisawa et al. | |
| 7,675,790 B1 * | 3/2010 | Wang et al. | 365/189.03 |
| 2011/0095803 A1 * | 4/2011 | Meijer et al. | 327/291 |
| 2011/0115526 A1 * | 5/2011 | Ouchi | 327/74 |

FOREIGN PATENT DOCUMENTS

CN 1968014 A 5/2007

* cited by examiner

*Primary Examiner* — Son Dinh
*Assistant Examiner* — Hien Nguyen
(74) *Attorney, Agent, or Firm* — Slater & Matsil, L.L.P.

(57) ABSTRACT

A first embodiment of the present invention is a system for generating a voltage comprising a comparator operable to compare an operation voltage to a reference voltage, control logic operable to selectively output as a control signal an incremented signal or a decremented signal based on a comparison of the operation voltage to the reference voltage by the comparator, and a device module operable to increase or decrease the operation voltage based on the control signal.

17 Claims, 11 Drawing Sheets

DIGITAL RETENTION VOLTAGE GENERATION

This application claims the benefit of U.S. Provisional Patent Application Ser. No. 61/248,019, filed on Oct. 2, 2009, and entitled "Digital Retention Voltage Generation," which application is incorporated herein by reference.

TECHNICAL FIELD

The present invention relates generally to digital circuitry, and more particularly to a system and method for digital retention voltage generation.

BACKGROUND

Generally, digital circuitry requires at least a specified minimum voltage to properly operate in a given mode. For example, for static random access memory (SRAM) to accurately maintain data stored within a SRAM cell during a retention mode, a minimum retention voltage is necessary. If the retention voltage drops below the minimum, the data stored in the SRAM risks being corrupted such that the stored data may be lost. Conventional circuits have addressed this issue, but each circuit design has its own disadvantages.

Conventional voltage generation circuits generally implement analog circuitry to provide a retention voltage. One known circuit employs two PMOS transistors coupled together to effectively form a diode in a retention mode. However, as technology sizes decrease and as power levels decrease, the voltage drop across the formed diode in the retention mode may be a limiting or preventative factor. For example, if the operating voltage of a system is 0.7 volts and a SRAM requires 0.5 volts in retention mode, but the voltage drop across the formed diode is 0.3 volts, then the voltage generation circuit would not provide an adequate retention voltage to the SRAM during the retention mode because the operation voltage of 0.7 volts minus the voltage drop of the diode of 0.3 volts would result in at most a generated retention voltage of 0.4 volts which is less than the required minimum.

A second known circuit uses an operational amplifier and a feedback loop to regulate the generated retention voltage. However, the use of the operational amplifier typically continually consumes power during the retention mode. Thus, the operational amplifier may consume large amounts of power in this mode.

Accordingly, there is a need in the art to overcome or obviate these stated deficiencies of the convention voltage generation circuits.

SUMMARY OF THE INVENTION

These and other problems are generally solved or circumvented, and technical advantages are generally achieved, by embodiments of the present invention.

In accordance with an embodiment of the present invention, a system for generating a voltage comprises a comparator operable to compare an operation voltage to a reference voltage, control logic operable to selectively output as a control signal an incremented signal or a decremented signal based on a comparison of the operation voltage to the reference voltage by the comparator, and a device module operable to increase or decrease the operation voltage based on the control signal.

In accordance with another embodiment of the present invention, a system for generating a voltage comprises a digital comparator that compares a first voltage to a reference voltage, a control unit comprising digital control logic that outputs a control signal during a current clock cycle, and a device module that operates to selectively turn on or turn off based on the control signal. The control signal comprises an incremented or a decremented version of the control signal from a previous clock cycle. Further, by the device module turning on or turning off, the first voltage is altered.

In accordance with yet another embodiment of the present invention, a method for generating a voltage comprises turning device modules on to initiate an operation voltage when a first mode starts, comparing the operation voltage to a reference voltage, and selectively turning on or off at least one device module to alter the operation voltage based on a comparison of the operation voltage to the reference voltage.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the present embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to embodiments in a specific context, namely a digital circuit for voltage generation for an SRAM. The invention may also be applied, however, to voltage generation for other functional units, such as combinational flip flops or latches that retain data during power down.

Figure 1:
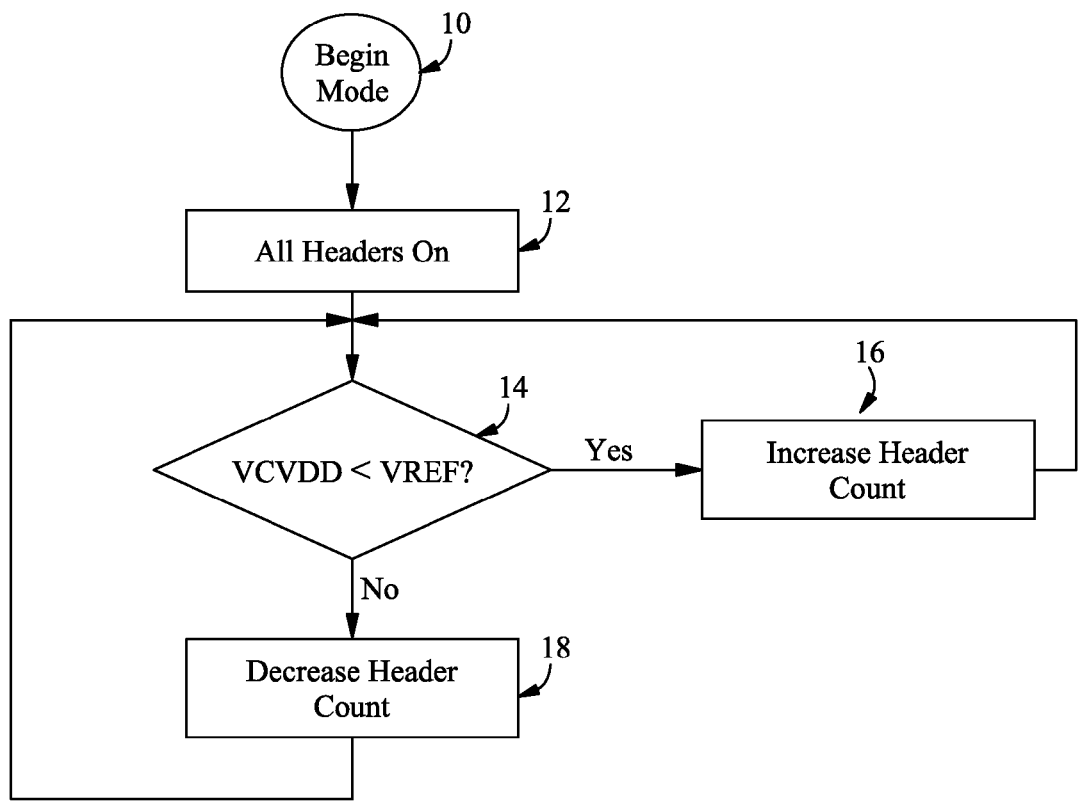
FIG. 1 is a process for the operation of a digital voltage generation circuit adapted for the use of a header in accordance with an embodiment of the present invention.

FIG. 1 illustrates a first embodiment of a process for the operation of a digital voltage generation circuit. The process begins at step 10 when a signal indicates the start or some voltage changes to indicate the start. At step 12, all headers are turned on. By turning on the headers, a supply voltage VCVDD input into an SRAM is initiated to or near the operating voltage. The headers will be discussed and illustrated in detail with regard to later figures.

At step 14, the supply voltage VCVDD is compared to a reference voltage VREF. The reference voltage VREF is a signal with a voltage level at least slightly above the minimum retention voltage required by the SRAM. As will be discussed later, the reference voltage VREF is at least slightly above the minimum retention voltage because the supply voltage VCVDD will oscillate between a voltage above the reference voltage VREF and a voltage below the reference voltage VREF when the system goes into a steady state. Thus, the low voltage of the supply voltage VCVDD while oscillating around VREF must be above the minimum retention voltage so the data stored in the SRAM will not become corrupted. The low value of a reference voltage VREF may be limited by the resolution of the voltage generation circuit. If the resolution is infinite, the reference voltage VREF may equal the data retention voltage. However, the reference voltage VREF may be a greater value to build in an operating margin into the system.

If the comparison at step 14 determines that the supply voltage VCVDD is not less than the reference voltage VREF, the process proceeds to step 18 where the header count is decreased. A header is turned off by each decrease causing the supply voltage VCVDD to be stepped down. On the other hand, if the comparison at step 14 determines that the supply voltage VCVDD is less than the reference voltage VREF, the process proceeds to step 16 where the header count is increased. A header is turned on by each increase causing the supply voltage VCVDD to be stepped up.

After steps 16 and 18, the process loops back to the comparison at step 14. By looping between these steps in this manner, the supply voltage VCVDD will be stepped up if the supply voltage VCVDD is less than the reference voltage VREF or will be stepped down if the supply voltage VCVDD is not less than the reference voltage VREF. Thus, the supply voltage VCVDD will oscillate around the reference voltage VREF at steady state.

Figure 2:
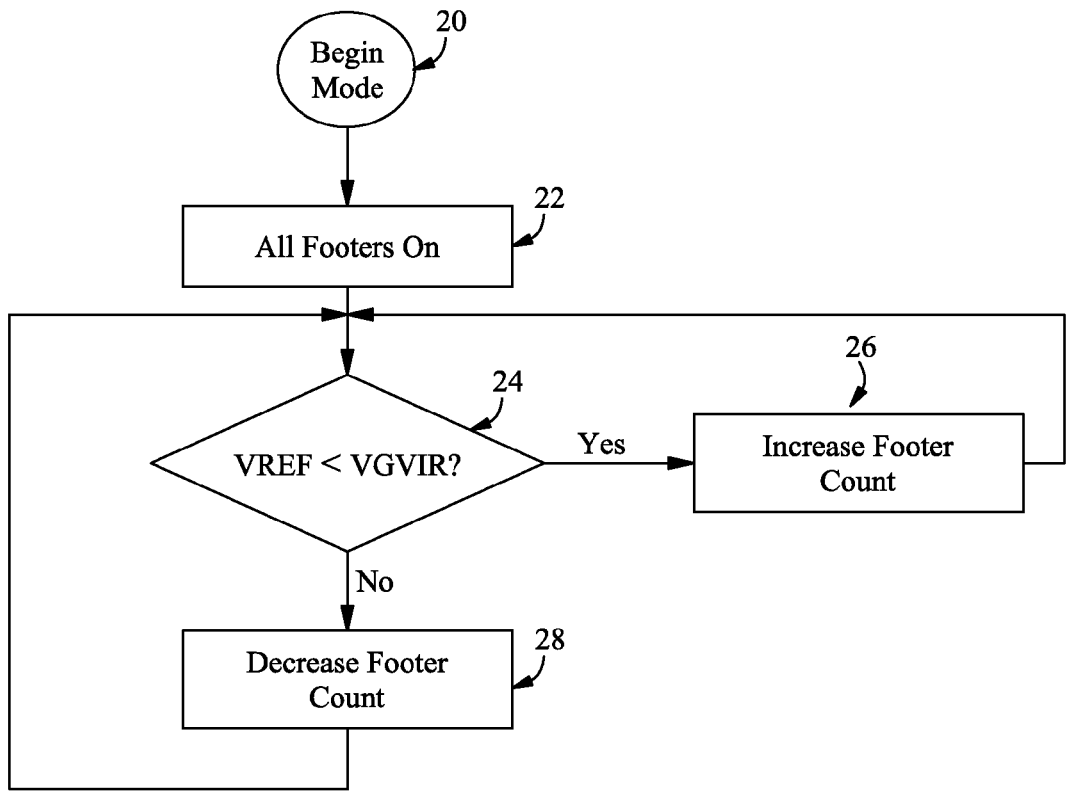
FIG. 2 is a process for the operation of a digital voltage generation circuit adapted for the use of a footer in accordance with an embodiment of the present invention.

FIG. 2 illustrates an alternative embodiment of a process for the operation of a digital voltage generation circuit when footers are used instead of headers. The process begins at step 20 when a signal indicates the start or some voltage changes to indicate the start. At step 22, all footers are turned on. By turning on the footers, a virtual ground voltage VGVIR coupled to an SRAM is initiated to or near the ground voltage. The footers will be discussed and illustrated in detail with regard to later figures.

At step 24, the virtual ground VGVIR is compared to a reference voltage VREF. In this process, the reference voltage VREF is a signal with a voltage level at least slightly below the maximum retention ground voltage required by the SRAM. Similar to above, the reference voltage VREF is at least slightly below the maximum retention ground voltage because the virtual ground VGVIR will oscillate between a voltage above the reference voltage VREF and a voltage below the reference voltage VREF when the system goes into a steady state. Thus, the high voltage of the virtual ground VGVIR while oscillating around VREF must be below the maximum retention ground voltage so the data stored in the SRAM will not become corrupted. The high value of a reference voltage VREF may be limited by the resolution of the voltage generation circuit. However, the reference voltage VREF may be a lower value to build in an operating margin into the system.

If the comparison at step 24 determines that the reference voltage VREF is not less than the virtual ground VGVIR, the process proceeds to step 28 where the footer count is decreased. A footer is turned off by each decrease causing the virtual ground VGVIR to be stepped up. On the other hand, if the comparison at step 24 determines that the reference voltage VREF is less than the virtual ground VGVIR, the process proceeds to step 26 where the footer count is increased. A footer is turned on by each increase causing the virtual ground VGVIR to be stepped down.

After steps 26 and 28, the process loops back to the comparison at step 24. By looping between these steps in this manner, the virtual ground VGVIR will oscillate around the reference voltage VREF at steady state similar to what was described with respect to FIG. 1.

Figure 3:
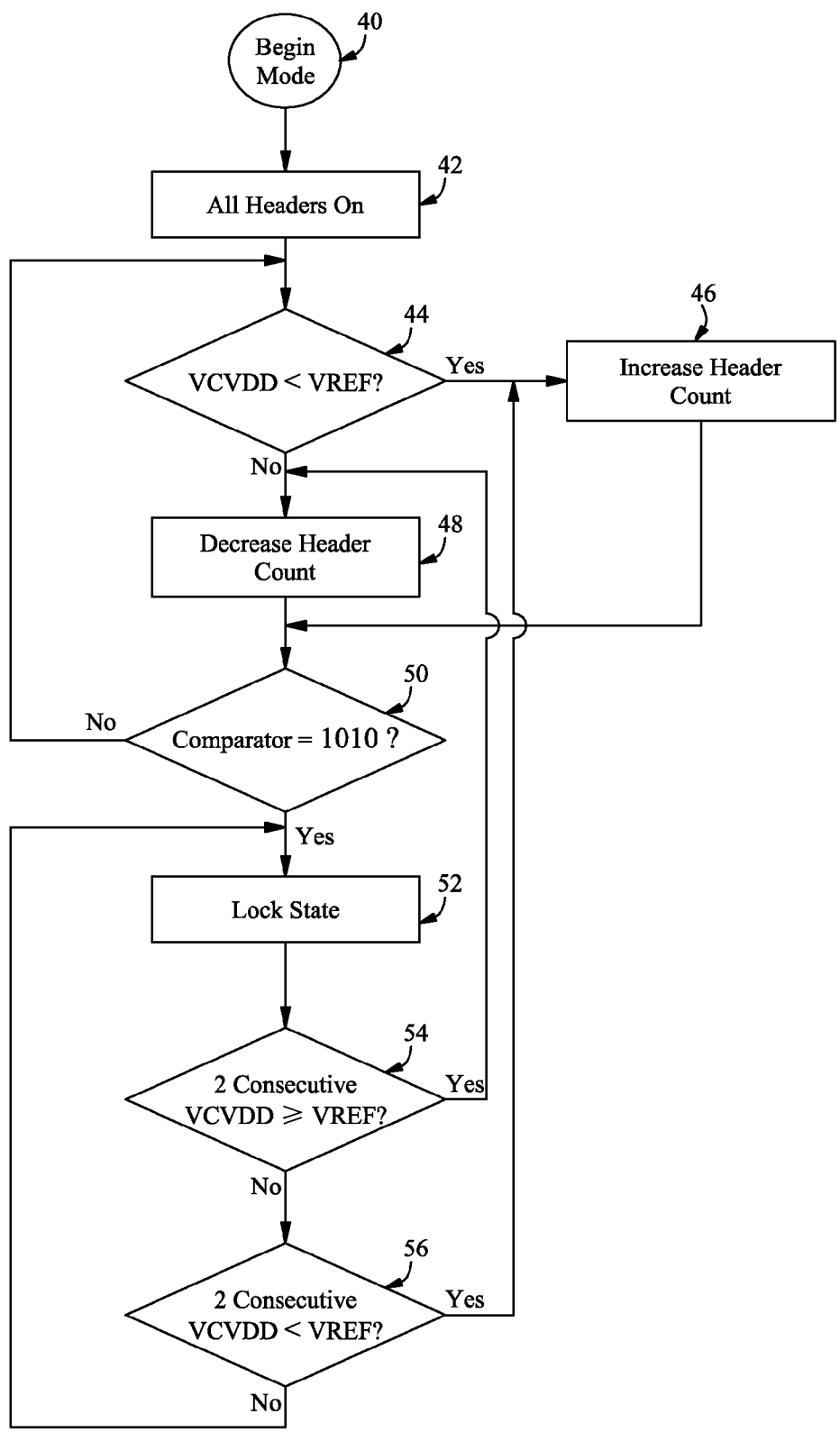
FIG. 3 is a process for the operation of a digital voltage generation circuit with a lock state adapted for the use of a header in accordance with an embodiment of the present invention.

FIG. 3 is an embodiment further optimizing the process of FIG. 1. Steps 40 through 48 correspond to steps 10 through 18, respectively, in FIG. 1. However, in FIG. 3, after steps 46 and 48, the process proceeds to step 50 in which the output for the previous four clock cycles of a comparator, which could also be used in the comparison at step 44, is analyzed to determine if the supply voltage VCVDD has oscillated during those four clock cycles. As shown in FIG. 3, a '1' represents a 'Yes' or 'True' if the supply voltage VCVDD is less than the reference voltage VREF, and a '0' represents a 'No' or 'False' to that comparison, or vice versa. Thus, an oscillation for four clock cycles may be represented by a '1010' or '0101'. Note that the determination at step 50 may analyze as few as two cycles and as many as desired.

If step 50 determines that the supply voltage VCVDD has not oscillated for four cycles, the process loops back to step 44; otherwise, the process enters into a lock state at step 52. In the lock state, the process is inactive with respect to altering any state of a header except to determine if either one of two conditions occurs at steps 54 and 56. At step 54, if the output of a comparator indicates that the supply voltage VCVDD is greater than or equal to (not less) than the reference voltage for two consecutive clock cycles, the process terminates the lock state and continues to step 48 to decrease the header count. Otherwise at step 54, the process continues to step 56 to determine if the output of a comparator indicates that the supply voltage VCVDD is less than the reference voltage VREF for two consecutive clock cycles. If the determination at step 56 is true or yes, the process terminates the lock state and proceeds to step 46 to increase the header count. Otherwise if both step 54 and step 56 return a false or no determination, the process continues in the lock state at step 52. Steps 54 and 56 may have conditions in which the number of cycles is smaller or much larger. Two cycles is merely arbitrary and is intended to be only exemplary.

Any circuitry implementing the process shown in FIG. 3 may cause the header count to not change while in the lock state. Thus, the process flow is optimized compared to the process of FIG. 1. Once the supply voltage VCVDD oscillates for four clock cycles such that the determination at step 50 is 'true' or 'yes', the header count may be inactive for at least two clock cycles until either one of the conditions terminate the lock state to proceed to either step 46 or step 48. Then, steps 44 through 50 may run four clock cycles until the condition at step 50 is met. Four clock cycles may be necessary because the earlier of the two clock cycles that caused either of the conditions at step 54 or step 56 to be met may need to be sufficiently removed from present clock cycle such that the two clock cycles are not within the previous four clock cycle window analyzed at step 50. But again, the clock cycles for each stage, such as during a lock stage or between lock stages, may be altered by differing designs to lessen or increase efficiency.

Figure 4:
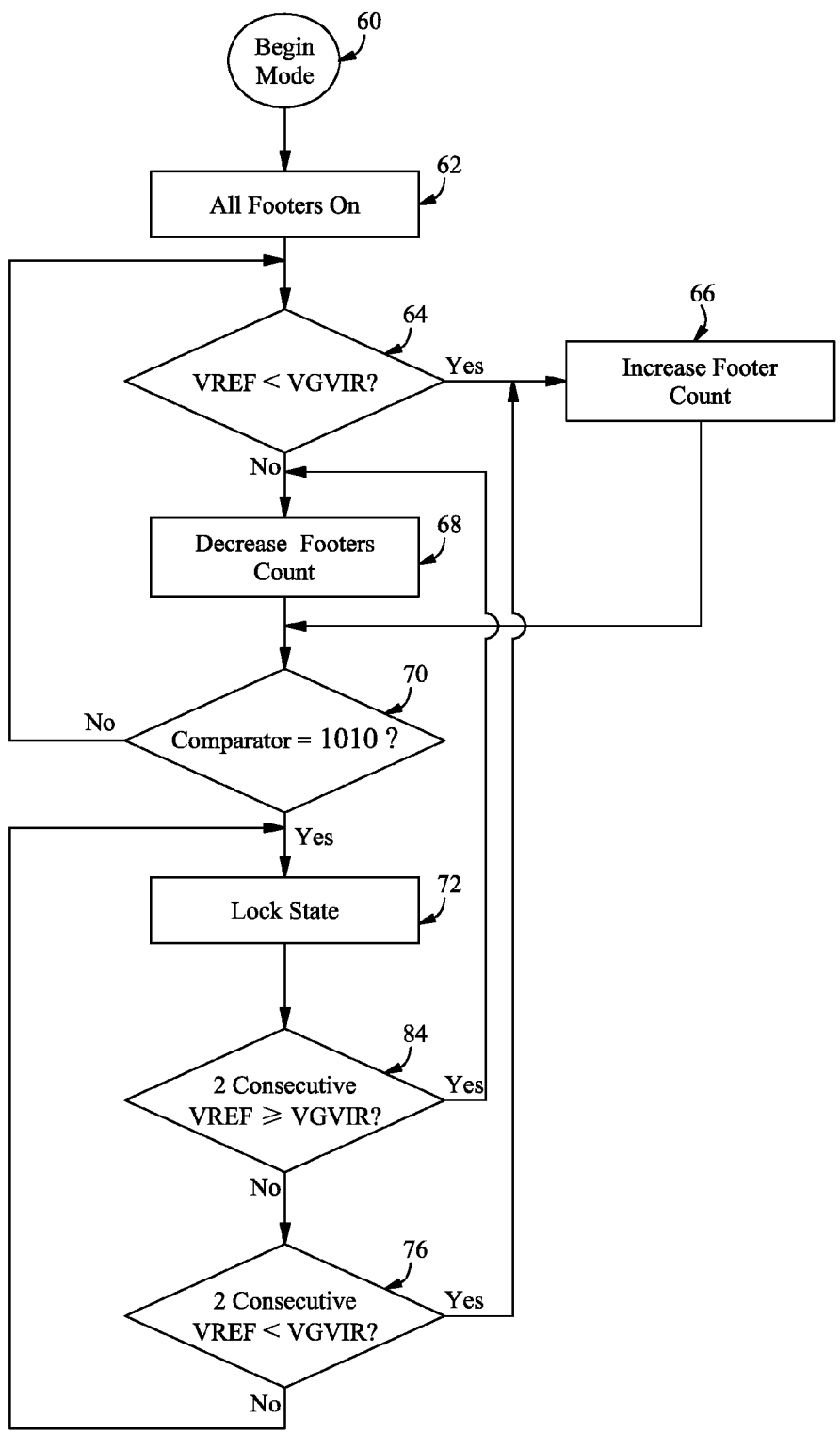
FIG. 4 is a process for the operation of a digital voltage generation circuit with a lock state adapted for the use of a footer in accordance with an embodiment of the present invention.

FIG. 4 is a process similar to FIG. 3 except that the process is adapted for the use of footers instead of headers. Steps 60 through 68 correspond to steps 20 through 28 in FIG. 2, respectively. Steps 70 through 76 are similar and use the same principles as steps 50 through 56 in FIG. 3, respectively, except steps 70 through 76 are adapted for use with a footer, particularly a virtual ground VGVIR is used in the conditions for steps 74 and 76.

Figure 5:
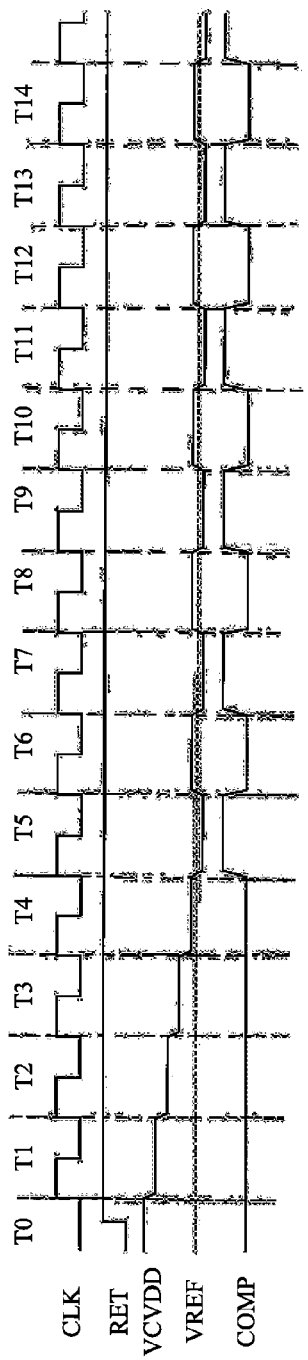
FIGS. 5 through 8 are exemplary timing diagrams of the processes in FIGS. 1 through 4, respectively.
Figure 6:
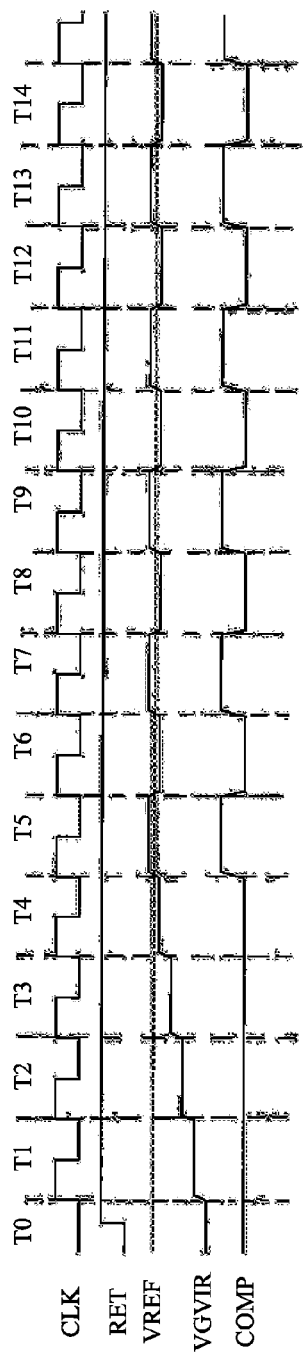
Figure 7:
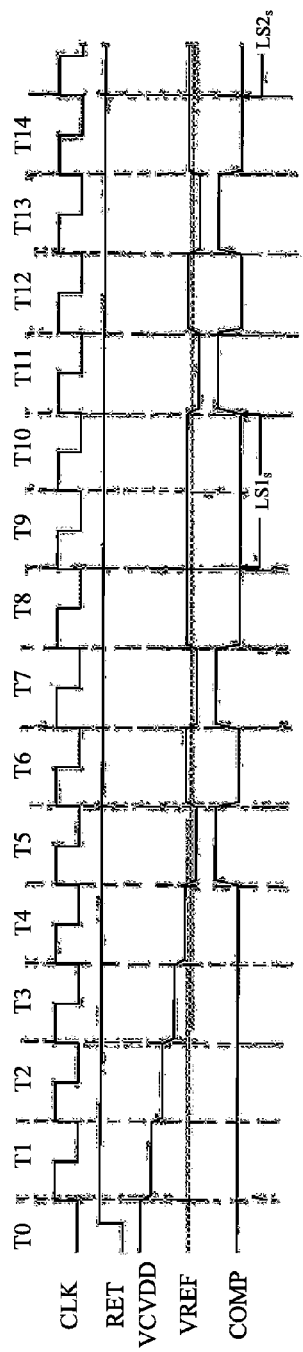
Figure 8:
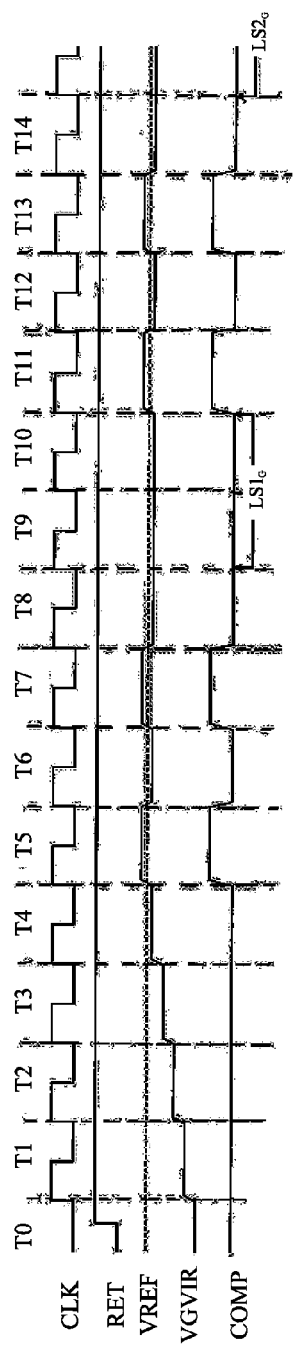

FIGS. 5 through 8 are exemplary timing diagrams of the processes illustrated in FIGS. 1 through 4, respectively. FIGS. 5 through 8 illustrate the voltage levels for a clock signal CLK, a retention mode signal RET, a reference voltage VREF, and a comparator output COMP over clock cycles T0 through T14. FIGS. 5 and 7 illustrate a supply voltage VCVDD because corresponding, and respective, FIGS. 1 and 3 are adapted for the use of headers. FIGS. 6 and 8 illustrate a virtual ground voltage VGVIR because corresponding, and respective, FIGS. 2 and 4 are adapted for the use of footers.

In FIG. 5, a retention mode signal RET is set to a high level at clock cycle T0 and the supply voltage VCVDD is initiated to the system operating voltage. Between clock cycles T1 through T4, the supply voltage VCVDD is not less than the reference voltage VREF such that the header count is decreased in each clock cycle, as shown in steps 14 and 18 in FIG. 1. At clock cycle T5, the supply voltage VCVDD is decreased below the reference voltage VREF which causes the header count to be increased, as shown in steps 14 and 16 in FIG. 1. Then, from clock cycle T6 until the time when the retention mode signal RET goes low, the supply voltage VCVDD oscillates around the reference voltage VREF because of alternating increasing and decreasing of the header count, as shown in steps 14 through 18 in FIG. 1. The comparator output COMP is high when the supply voltage VCVDD is less than the reference voltage VREF and is low when the supply voltage VCVDD is greater than or equal to (not less than) the reference voltage VREF.

In FIG. 6, a retention mode signal RET is set to a high level at clock cycle T0 and the virtual ground VGVIR is initiated to electrical ground. Between clock cycles T1 through T4, the reference voltage VREF is not less than the virtual ground VGVIR such that the footer count is decreased in each clock cycle, as shown in steps 24 and 28 in FIG. 2. At clock cycle T5, the virtual ground VGVIR is increased above the reference voltage VREF which causes the footer count to be increased, as shown in steps 24 and 26 in FIG. 2. Then, from clock cycle T6 until the time when the retention mode signal RET goes low, the virtual ground VGVIR oscillates around the reference voltage VREF because of alternating increasing and decreasing of the footer count, as shown in steps 24 through 28 in FIG. 2. The comparator output COMP is high when the reference voltage VREF is less than the virtual ground VGVIR and is low when the reference voltage VREF is greater than or equal to (not less than) the virtual ground VGVIR.

FIG. 7 illustrates a similar operation to FIG. 5 until clock cycle T9 is reached. At clock cycle T9, the previous four clock cycles, clock cycles T5 through T8, have an oscillating supply voltage VCVDD around the reference voltage VREF such that the comparator output COMP is '1010' for the previous four clock cycles T5 through T8. Thus, the process is placed into a first lock state $LS1_S$, as shown at steps 50 and 52 in FIG. 3. The first lock state $LS1_S$ lasts for two clock cycles, clock cycles T9 and T10, until the condition that the supply voltage VCVDD is not less than the reference voltage VREF for two consecutive clock cycles, as shown by step 54 in FIG. 3. Once the condition is met, the header count is decreased, as shown in step 48 in FIG. 3, and the process resumes operation, as shown in steps 44 through 50 in FIG. 3, resulting in an oscillating supply voltage VCVDD around the reference voltage VREF during clock cycles T11 through T14. After clock cycle T14, the process is placed into a second lock state $LS2_S$.

FIG. 8 illustrates a similar operation to FIG. 6 until clock cycle T9 is reached. At clock cycle T9, the previous four clock cycles, clock cycles T5 through T8, have an oscillating virtual ground VGVIR around the reference voltage VREF such that the comparator output COMP is '1010' for the previous four clock cycles T5 through T8. Thus, the process is placed into a first lock state $LS1_G$, as shown at steps 70 and 72 in FIG. 4. The first lock state $LS1_G$ lasts for two clock cycles, clock cycles T9 and T10, until the condition that the reference voltage VREF is greater than or equal to (not less than) the virtual ground VGVIR for two consecutive clock cycles, as shown by step 74 in FIG. 4. Once the condition is met, the footer count is decreased, as shown in step 68 in FIG. 4, and the process resumes operation, as shown in steps 64 through 70 in FIG. 4, resulting in an oscillating virtual ground VGVIR around the reference voltage VREF during clock cycles T11 through T14. After clock cycle T14, the process is placed into a second lock state $LS2_G$.

Figure 9:
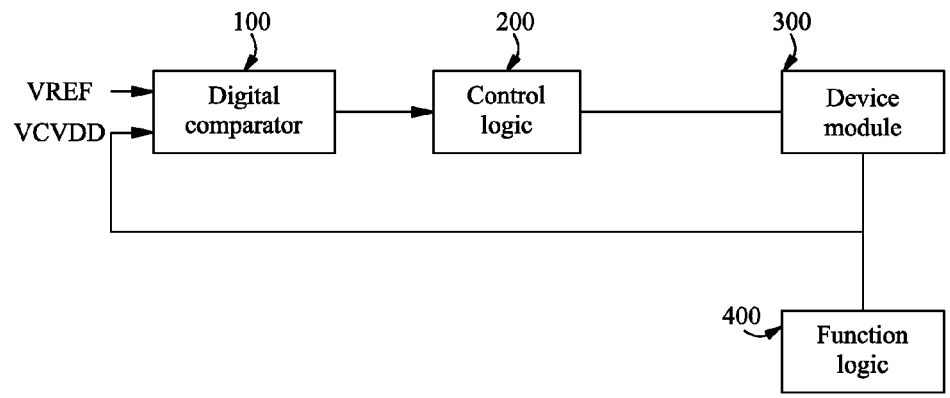
FIG. 9 is a system for digitally generating a retention voltage adapted for the use of a header in accordance with an embodiment of the present invention.

FIG. 9 is a system for digitally generating a retention voltage in accordance with an embodiment of the present invention. The system comprises a digital comparator 100, control logic 200, and a device module 300 electrically coupled to function logic 400, which may be SRAM or the like. The digital comparator 100 compares a reference voltage VREF with the supply voltage VCVDD that is input into the function logic 400. The result of the comparison is output from the digital comparator 100 and input into the control logic 200. Through a series of digital logic steps, the control logic 200 uses the output from the digital comparator 100 to determine a control signal that is output to the device module 300. Based on the control signal, the device module 300 will increase or decrease the supply voltage VCVDD or will remain inactive. The device module 300 uses headers in this embodiment, and the system is adapted for the use of the headers. Further, the system may operate in a manner similar to the process in FIG. 1 and the time chart in FIG. 5, or the process in FIG. 3 and the time chart in FIG. 7.

Figure 10:
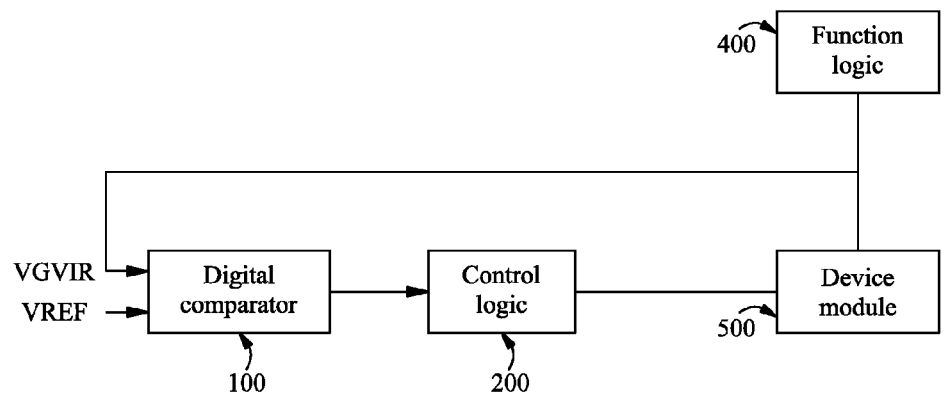
FIG. 10 is a system for digitally generating a retention voltage adapted for the use of a footer in accordance with an embodiment of the present invention.

FIG. 10 is a system for digitally generating a retention voltage in accordance with an embodiment of the present invention similar to FIG. 9, except adapted for the use of a footer instead of a header. The system comprises a digital comparator 100, control logic 200, and a device module 500 electrically coupled to function logic 400, which may be SRAM or the like. The digital comparator 100 compares a reference voltage VREF with the virtual ground voltage VGVIR that is electrically coupled to the function logic 400. The result of the comparison is output from the digital comparator 100 and input into the control logic 200. Through a series of digital logic steps, the control logic 200 uses the output from the digital comparator 100 to determine a control signal that is output to the device module 500. Based on the control signal, the device module 500 will increase or decrease the virtual ground voltage VGVIR or will remain inactive. Further, the system may operate in a manner similar to the process in FIG. 2 and the time chart in FIG. 6, or the process in FIG. 4 and the time chart in FIG. 8.

Figure 11:
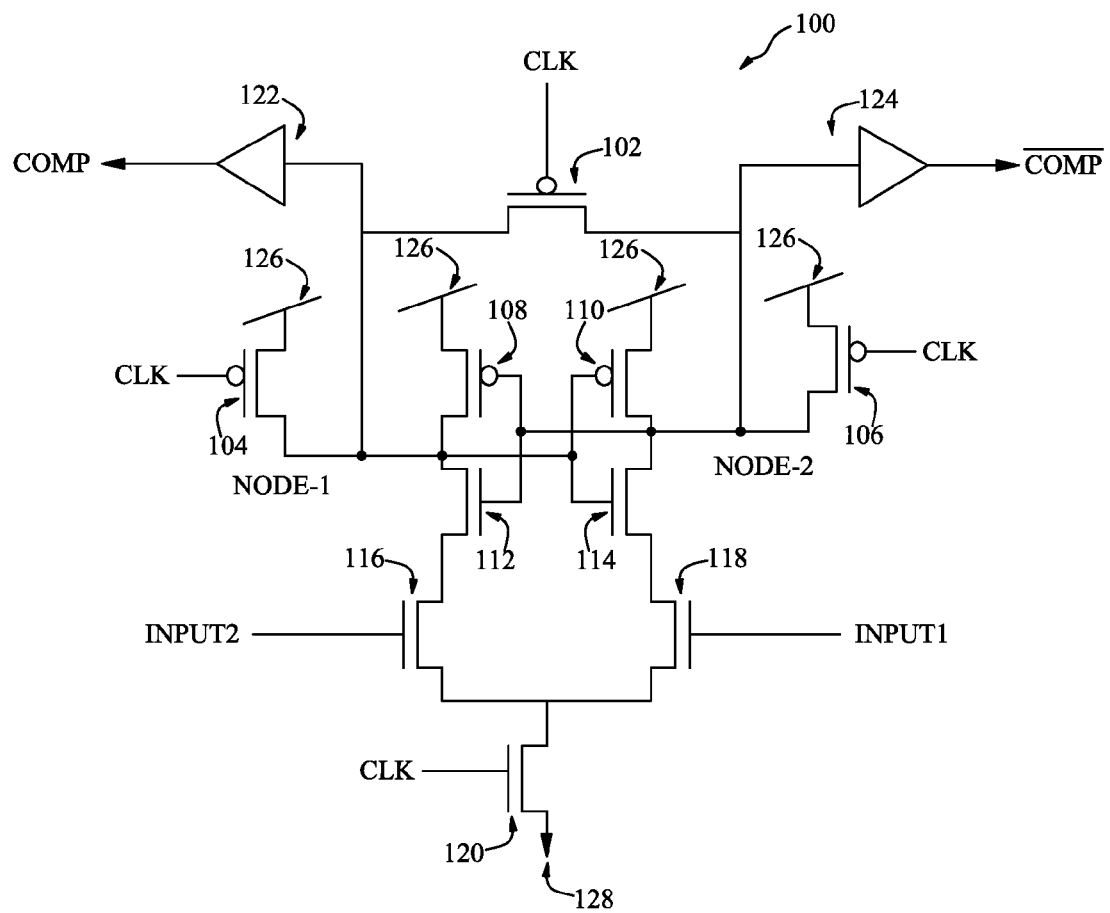
FIG. 11 is a schematic of an exemplary digital comparator in accordance with an embodiment of the present invention.

FIG. 11 is a schematic of an exemplary digital comparator 100. The digital comparator 100 comprises PMOS transistors 102, 104, 106, 108, and 110, NMOS transistors 112, 114, 116, 118, and 120, and buffers 122 and 124. PMOS transistor 108 and NMOS transistors 112 and 116 are serially coupled between power supply 126 and NMOS transistor 120. PMOS transistor 110 and NMOS transistors 114 and 118 are serially coupled between power supply 126 and NMOS transistor 120. NMOS transistor 120 has a drain coupled to NMOS transistors 116 and 118 and has a source coupled to ground 128. NODE-1 electrically couples the gates of PMOS transistor 110 and NMOS transistor 114, the drain of PMOS transistor 108, the drain of NMOS transistor 112, the drain of PMOS transistor 104, an input to buffer 122, and a source/drain of PMOS transistor 102. The source of PMOS transistor 104 is coupled to the power supply 126. NODE-2 electrically couples the gates of PMOS transistor 108 and NMOS transistor 112, the drain of PMOS transistor 110, the drain of NMOS transistor 114, the drain of PMOS transistor 106, an input to buffer 124, and a source/drain of PMOS transistor 102. The source of PMOS transistor 106 is coupled to the power supply 126. A clock signal CLK is input to the gates of PMOS transistors 102, 104, and 106 and NMOS transistor 120. A first input INPUT1 is input to the gate of NMOS transistor 118, and a second input INPUT2 is input into the gate of NMOS transistor 116. The output of buffer 122 is the result of the comparison COMP, and the output of buffer 124 is the inverse of the result of the comparison $\overline{COMP}$.

The digital comparator operates to output the result of the comparison COMP or the inverse of the comparison $\overline{COMP}$ during the high voltage portion of the clock cycle. When the clock is low, PMOS transistors 102, 104, and 106 are in saturation mode and NMOS transistor 120 is off such that NODE-1 and NODE-2 are both at the same voltage potential which is the voltage of the power supply 126. When the clock is high, PMOS transistors 102, 104, and 106 are off, and NMOS transistor 120 is in saturation mode. Thus, NODE-1 and NODE-2 are electrically isolated from each other. If the second input INPUT2 into the gate of NMOS transistor 116 is less than first input INPUT1 into the gate of NMOS transistor 118, the voltage level at NODE-2 will be less than the voltage at NODE-1. At that point, the PMOS transistors 108 and 110 and the NMOS transistors 112 and 114 will drive NODE-2 to ground, or a logical '0', and will drive NODE-1 to a high voltage, or a logical '1'. Accordingly, NODE-1 will be output through the buffer 122 the comparison output COMP as '1' when second input INPUT2 is less than first input INPUT1. Likewise, NODE-2 will be output through the buffer 124 as the inverse comparison output $\overline{COMP}$ as '0' when the second input INPUT2 is less than the first input INPUT1. Similarly, when the second input INPUT2 is greater than first input INPUT1, the comparison output COMP will be '0', and the inverse comparison output $\overline{COMP}$ will be '1'.

Figure 12:
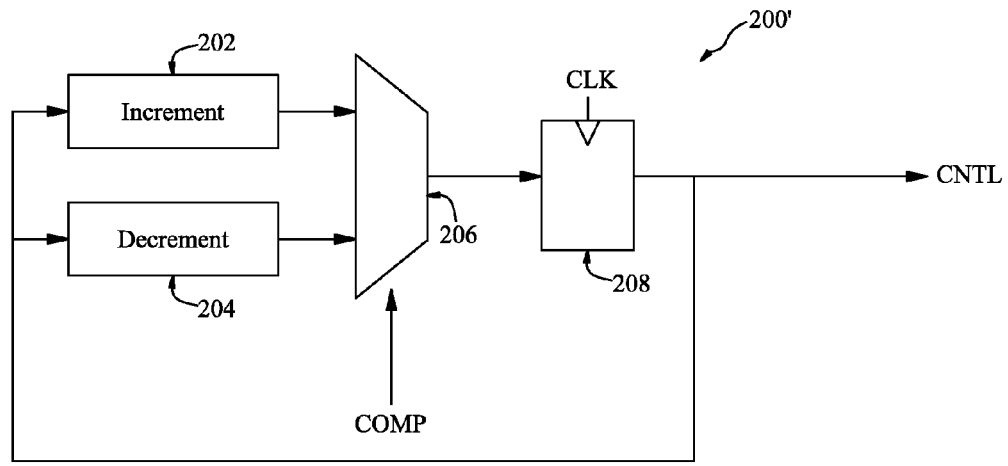
FIG. 12 is a schematic of an exemplary control logic without lock state detection in accordance with an embodiment of the present invention.

FIG. 12 is a schematic of exemplary control logic 200' without lock state detection, for example, control logic implementing the process of FIG. 1 and the timing chart of FIG. 5. The control logic 200' comprises an increment function 202, a decrement function 204, a multiplexer 206, and a flip-flop 208. The increment function 202 increases a header or footer count, while the decrement function 204 decreases a header or footer count. The increment function 202 and the decrement function 204 may each comprise an adder or a shift register. If an adder is used for each of the increment function 202 and the decrement function 204, for each clock cycle, the adder in each function will either add one to the m-bit control signal CNTL from the previous clock cycle or will add a negative one to the m-bit control signal CNTL from the previous clock cycle, depending on the appropriate functionality needed for the adder. If a shift register is used for the increment function 202 and the decrement function 204, the register may shift the previous clock cycle control signal CNTL one bit left or may shift the previous clock cycle control signal CNTL one bit right.

The result of the increment function 202 and decrement function 204 are output as m-bit signals to the multiplexer 206. The multiplexer 206 selectively outputs either the m-bit signal of the increment function 202 or the m-bit signal of the decrement function 204 based on the results of the comparison COMP from the digital comparator 100. If the comparison result COMP is '1', then the m-bit signal of the increment function 202 is output from the multiplexer 206. Alternatively, if the comparison result COMP is '0', then the m-bit signal of the decrement function 204 is output from the multiplexer 206. The output from the multiplexer 206 is then input into the flip-flop 208 that is controlled by the rising or falling edge of the clock signal CLK. The output of the flip-flop 208 is the m-bit control signal CNTL output from the control logic 200'.

Figure 13:
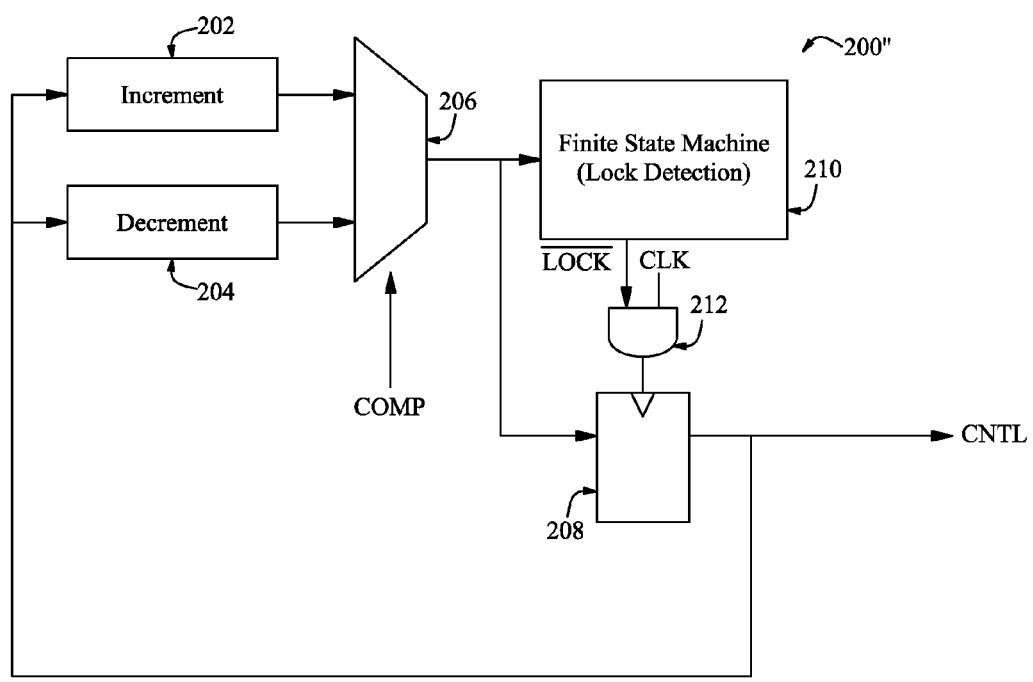
FIG. 13 is a schematic of an exemplary control logic with lock state detection in accordance with an embodiment of the present invention.

FIG. 13 is a schematic of exemplary control logic 200" with lock state detection, for example, control logic implementing the process of FIG. 3 and the timing chart of FIG. 7. The control logic 200" comprises the same components as the control logic 200' of FIG. 11, plus a finite state machine 210 and an AND gate 212. The control logic 200" functions similar to the control logic 200' of FIG. 11, except that the finite state machine 210 is able to detect a lock condition to lock the flip-flop 208 to prevent a change in the control signal CNTL during the lock state. The finite state machine 210, in this example, detects a lock condition by determining when an oscillating pattern of an incremented m-bit signal and a decremented m-bit signal is input into the finite state machine 210 for four consecutive clock cycles. Alternatively, the finite state machine 210 may detect a lock condition by having the comparison result COMP input and determining when the comparison result COMP oscillates for four clock cycles.

The finite state machine 210 outputs an inverse lock signal $\overline{LOCK}$ that outputs a high voltage level, or '1' when the lock state condition has not been detected and a low voltage level, or '0' when the lock state condition has been detected. Thus, the inverse lock signal $\overline{LOCK}$ is able to suppress the clock signal CLK by being input into the AND gate 212 along with the clock signal CLK. The output of the AND gate 212 controls the operation of the flip-flop 208.

Further, the finite state machine 210 is operable to detect a condition to terminate the lock state. In this embodiment, the finite state machine 210 can detect when the output of the multiplexer is two consecutive increment m-bit signals or two consecutive decrement m-bit signals. In another embodiment, the finite state machine 210 may have the comparison result COMP input and determine when two consecutive comparison results COMP are equal. Once the detection is made, the inverse lock signal $\overline{LOCK}$ is changed from '0' to '1' such that the clock signal CLK is no longer suppressed at the AND gate 212.

Figure 14:
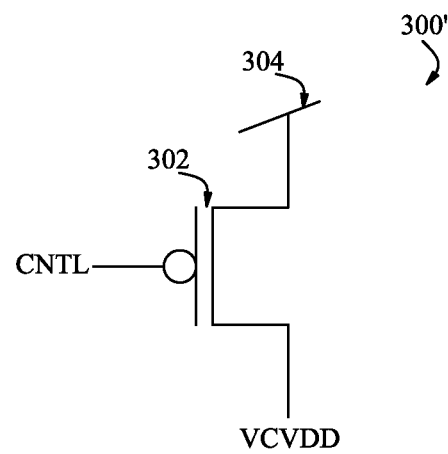
FIG. 14 is a first exemplary header for the device module in accordance with an embodiment of the present invention.
Figure 15:
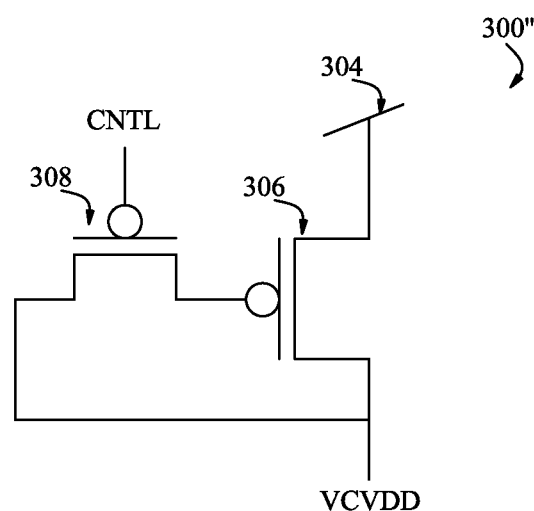
FIG. 15 is a second exemplary header for the device module in accordance with an embodiment of the present invention.

FIG. 14 is an exemplary header 300' for the device module 300. The header 300' comprises a PMOS transistor 302 that has a source electrically coupled to a power supply 304, one bit of the m-bit control signal CNTL input into a gate, and a drain that outputs the supply voltage VCVDD. FIG. 15 is another exemplary header 300" for the device module 300. The header 300" comprises two PMOS transistors 306 and 308 electrically coupled in a manner to form an effective diode when a low voltage, or '0', is present at the gate of PMOS transistor 308. The source of the PMOS transistor 306 is electrically coupled to a power supply 304. The PMOS transistor 308 has a source/drain electrically coupled to the gate of the PMOS transistor 306. The other source/drain of the PMOS transistor 308 is electrically coupled to the drain of the PMOS transistor 306. This node is the output node for the supply voltage VCVDD. One bit of the m-bit control signal CNTL is input into the gate of the PMOS transistor 308. A device module 300 may comprise an m-number of headers 300' or 300", or any combination thereof.

Referring back to the system in FIG. 9 when headers are used, the first input INPUT1 of the digital comparator 100 in FIG. 11 is the reference voltage VREF, and the second input INPUT2 is the supply voltage VCVDD. Thus, the comparison result COMP is 'true' or '1' when the supply voltage VCVDD is less than the reference voltage VREF as shown in steps 14 and 44 in FIGS. 1 and 3, respectively. The increment function 202 in FIGS. 12 and 13 may be an adder that adds a negative one to the previous clock cycle's m-bit control signal CNTL or may be a right shift register. By decreasing the m-bit control signal when the headers 300' or 300" in FIGS. 14 and 15 are used, the header count is increased, like in steps 18 and 48 in FIGS. 1 and 3, increasing the number of headers that are turned on and the supply voltage VCVDD. Similarly, the decrement function 204 in FIGS. 12 and 13 may be an adder that adds one to the previous clock cycle's m-bit control signal CNTL or may be a left shift register. By increasing the m-bit control signal when the headers 300' or 300" in FIGS. 14 and 15 are used, the header count is decreased, like in steps 16 and 46 in FIGS. 1 and 3, decreasing the number of headers that are turned on and the supply voltage VCVDD.

Thus, in this configuration, when a retention mode is initiated, such as in steps 10 and 40 in FIGS. 1 and 3, the m-bit signals in both the increment function 202 and the decrement function 204 in FIGS. 12 and 13 are set to where each of the m-bits is '0', thus turning on all headers, like in steps 12 and 42 in FIGS. 1 and 3. Further, when the supply voltage VCVDD is less than the reference voltage VREF, the comparison result COMP outputs a '1' that causes the multiplexer 206 in FIGS. 12 and 13 to output the signal from the increment function 202 as the m-bit control signal CNTL to the headers which causes an increase in the supply voltage VCVDD, like in steps 16 and 46 in FIGS. 1 and 3, respectively. Similarly, when the supply voltage VCVDD is not less than the reference voltage VREF, the comparison result COMP outputs a '0' that causes the multiplexer 206 to output the signal from the decrement function 204 as the m-bit control signal CNTL to the headers which causes a decrease in the supply voltage VCVDD, like in steps 18 and 48 in FIGS. 1 and 3, respectively. Further, the finite state machine of FIG. 13 may be used to add the extra functionality, as discussed above, shown in FIG. 3 that is absent in FIG. 1.

Figure 16:
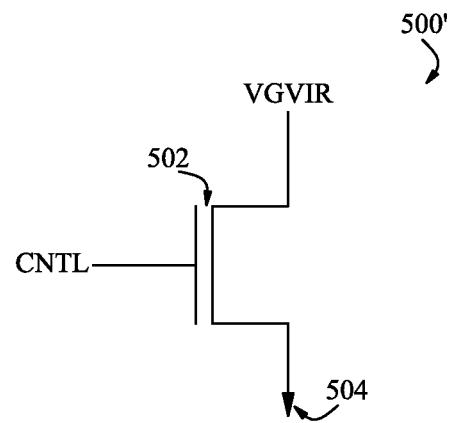
FIG. 16 is a first exemplary footer for the device module in accordance with an embodiment of the present invention.
Figure 17:
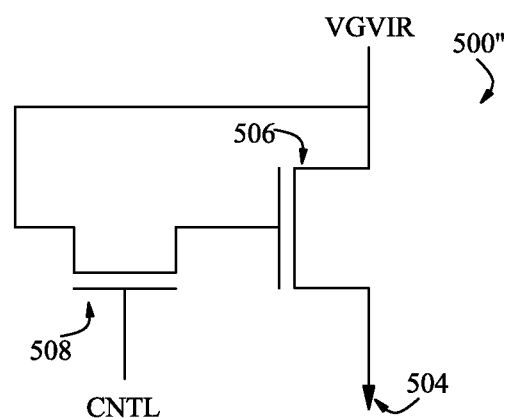
FIG. 17 is a second exemplary footer for the device module in accordance with an embodiment of the present invention.

FIG. 16 is an exemplary footer 500' for the device module 500. The footer 500' comprises a NMOS transistor 502 that has a source electrically coupled to ground 504, one bit of the m-bit control signal CNTL input into a gate, and a drain that couples the virtual ground voltage VGVIR. FIG. 17 is another exemplary footer 500" for the device module 500. The footer 500" comprises two NMOS transistors 506 and 508 electrically coupled in a manner to form an effective diode when a high voltage, or '1', is present at the gate of NMOS transistor 508. The source of the NMOS transistor 506 is electrically coupled to ground 504. The NMOS transistor 508 has a source/drain electrically coupled to the gate of the NMOS transistor 506. The other source/drain of the NMOS transistor 508 is electrically coupled to the drain of the NMOS transistor 506. This node is the virtual ground VGVIR. One bit of the m-bit control signal CNTL is input into the gate of the NMOS transistor 508. A device module 500 may comprise an m-number of headers 500' or 500", or any combination thereof.

Referring back to the system in FIG. 10 when footers are used, the first input INPUT1 of the digital comparator 100 in FIG. 11 is the virtual ground voltage VGVIR, and the second input INPUT2 is the reference voltage VREF. Thus, the comparison result COMP is 'true' or '1' when the reference voltage VREF is less than the virtual ground voltage VGVIR as shown in steps 24 and 64 in FIGS. 2 and 4, respectively. The increment function 202 in FIGS. 12 and 13 may be an adder that adds a one to the previous clock cycle's m-bit control signal CNTL or may be a left shift register. By increasing the m-bit control signal when the footers 500' or 500" in FIGS. 16 and 17 are used, the footer count is increased, like in steps 28 and 68 in FIGS. 2 and 4, increasing the number of footers that are turned on and decreasing the virtual ground VGVIR. Similarly, the decrement function 204 in FIGS. 12 and 13 may be an adder that adds a negative one to the previous clock cycle's m-bit control signal CNTL or may be a right shift register. By decreasing the m-bit control signal when the footers 500' or 500" in FIGS. 16 and 17 are used, the footer count is decreased, like in steps 26 and 66 in FIGS. 2 and 4, decreasing the number of footers that are turned on and increasing the virtual ground voltage VGVIR.

Thus, in this configuration, when a retention mode is initiated, such as in steps 20 and 60 in FIGS. 2 and 4, the m-bit signals in both the increment function 202 and the decrement function 204 in FIGS. 12 and 13 are set to where each of the m-bits is '1', thus turning on all footers, like in steps 22 and 62 in FIGS. 2 and 4. Further, when the reference voltage VREF is less than the virtual ground VGVIR, the comparison result COMP outputs a '1' that causes the multiplexer 206 in FIGS. 12 and 13 to output the signal from the increment function 202 as the m-bit control signal CNTL to the footers which causes an decrease in the virtual ground voltage VGVIR, like in steps 26 and 66 in FIGS. 2 and 4, respectively. Similarly, when the reference voltage VREF is not less than the virtual ground VGVIR, the comparison result COMP outputs a '0' that causes the multiplexer 206 to output the signal from the decrement function 204 as the m-bit control signal CNTL to the footers which causes an increase in the virtual ground voltage VGVIR, like in steps 28 and 68 in FIGS. 2 and 4, respectively. Further, the finite state machine of FIG. 13 may be used to add the extra functionality, as discussed above, shown in FIG. 4 that is absent in FIG. 2.

Embodiments of the present invention have many advantages over prior art circuits. For example, the embodiments described above generally require only N cycle dynamic power plus whatever power is consumed by leakage, which is less than the continuous power consumption of analog prior art circuits. Further, the complexity of the embodiments is much lower than conventional circuits. Known circuits generally require complex custom designs for each application, whereas embodiments may require simple synthesis for a control and a custom design for a comparator. Also, the area penalty for embodiments is typically much smaller than conventional analog circuits. Next, the scalability of embodiments is generally much higher than conventional analog circuits. More over, the voltage drop across combinations of headers and/or footers may not be a limiting factor because the combination can be dynamically programmed for different voltages for different applications as opposed to the statically designed conventional circuits. Further, the risks involved in initially implementing embodiments is much lower than known analog circuits because embodiments may be more easily tested than the analog circuits.

Although the present invention and its advantages have been described in detail, it should be understood that various changes, substitutions and alterations can be made herein without departing from the spirit and scope of the invention as defined by the appended claims. For example, many of the features and functions discussed above can be implemented in software, hardware, or firmware, or a combination thereof. As another example, it will be readily understood by those skilled in the art that altering the logic used in a system may altered, such as changing between high logic and low logic, or changing control timing between a rising edge and a falling edge, while remaining within the scope of the present invention. Further, many of the patterns cited in the above examples, such as the '1010' pattern; the number of cycles used before initiating a lock state, such as the four clock cycles; or the number of cycles consumed while in the lock state, such as two clock cycles are intended only to be exemplary and not to limit the present invention. A person having skill in the art will know that these examples may be easily changed or altered to accomplish the same functionality. Further, the use of headers and footers are not exclusive within a single system, but headers and footers may be used in combination in a single system.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system for generating a voltage, the system comprising:
    a comparator configured to compare an operation voltage to a reference voltage;
    control logic configured to selectively output as a control signal an incremented signal or a decremented signal based on a comparison of the operation voltage to the reference voltage by the comparator, the incremented signal or the decremented signal being an incremented or decremented version, respectively, of the control signal from a previous time period, the control logic being further configured to enter a lock state to prevent the control logic from changing the control signal based on a first condition; and
    a device module configured to increase or decrease the operation voltage based on the control signal.

2. The system of claim 1, wherein the first condition comprises the operation voltage oscillating around the reference voltage.

3. The system of claim 1, wherein the control logic is further configured to terminate the lock state based on a second condition.

4. The system of claim 1, wherein the device module comprises a header.

5. The system of claim 4, wherein the operation voltage is a supply voltage.

6. The system of claim 1, wherein the device module comprises a footer.

7. The system of claim 6, wherein the operation voltage is a virtual ground voltage.

8. A system comprising:
    a comparator configured to compare an operation voltage to a reference voltage;
    control logic configured to selectively output as a control signal an incremented signal or a decremented signal based on a comparison of the operation voltage to the reference voltage by the comparator, the incremented signal or the decremented signal being an incremented or decremented version, respectively, of the control signal from a previous time period;
    a device module configured to increase or decrease the operation voltage based on the control signal; and
    a static random access memory (SRAM) electrically coupled to the device module, wherein a voltage between the SRAM and the device module is the operation voltage.

9. A system for generating a voltage, the system comprising:
    a digital comparator that compares a first voltage to a reference voltage;
    a control unit comprising digital control logic that outputs a control signal during a current clock cycle, wherein the control signal comprises an incremented or a decremented version of the control signal from a previous clock cycle, the control unit further comprising additional digital control logic that locks the control signal when a first condition occurs; and
    a device module that operates to selectively turn on or turn off based on the control signal, wherein by turning on or turning off, the first voltage is altered.

10. The system of claim 9, wherein the first condition comprises the first voltage oscillating around the reference voltage.

11. The system of claim 9, wherein the additional digital control logic terminates the locking of the control signal when a second condition occurs.

12. The system of claim 9, wherein the device module comprises a header and the first voltage is a supply voltage, or wherein the device module comprises a footer and the first voltage is a virtual ground voltage.

13. A method for generating a voltage, the method comprising:
    turning device modules on to initiate an operation voltage when a first mode starts;
    comparing the operation voltage to a reference voltage;
    incrementing or decrementing a control signal from a previous time period based on the comparing;
    selectively turning on or off at least one device module when the control signal is incremented or decremented to alter the operation voltage; and
    entering a lock state when a first condition occurs, wherein no device module is turned on or turned off during the lock state.

14. The method of claim 13, wherein the first condition comprises the operation voltage oscillating around the reference voltage.

15. The method of claim 13, further comprising terminating the lock state when a second condition occurs.

16. The method of claim 13, further comprising continuously comparing the operation voltage to the reference voltage and selectively turning on or off at least one device module while in the first mode.

17. The method of claim 13, wherein the device modules comprise headers or footers.

* * * * *